US011555147B2

(12) United States Patent
Cohen et al.

(10) Patent No.: US 11,555,147 B2
(45) Date of Patent: Jan. 17, 2023

(54) METAL HALIDE SCINTILLATORS WITH REDUCED HYGROSCOPICITY AND METHOD OF MAKING THE SAME

(71) Applicant: Siemens Medical Solutions USA, Inc., Malvern, PA (US)

(72) Inventors: Peter Carl Cohen, Knoxville, TN (US); Alexander Andrew Carey, Lenoir City, TN (US); Mark S. Andreaco, Knoxville, TN (US); Matthias J. Schmand, Lenoir City, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 317 days.

(21) Appl. No.: 15/941,348

(22) Filed: Mar. 30, 2018

(65) Prior Publication Data

US 2018/0223186 A1    Aug. 9, 2018

Related U.S. Application Data

(63) Continuation-in-part of application No. 13/646,759, filed on Oct. 8, 2012, now Pat. No. 9,966,162.

(60) Provisional application No. 61/545,262, filed on Oct. 10, 2011, provisional application No. 61/545,253, filed on Oct. 10, 2011.

(51) Int. Cl.
| | | |
|---|---|---|
| *C09K 11/77* | (2006.01) | |
| *C30B 29/12* | (2006.01) | |
| *C30B 11/02* | (2006.01) | |
| *G21K 4/00* | (2006.01) | |
| *C30B 11/00* | (2006.01) | |

(52) U.S. Cl.
CPC ...... *C09K 11/7773* (2013.01); *C09K 11/7772* (2013.01); *C30B 11/00* (2013.01); *C30B 11/02* (2013.01); *C30B 29/12* (2013.01); *G21K 4/00* (2013.01)

(58) Field of Classification Search
CPC ............ C09K 11/7773; C09K 11/7772; C30B 11/00; C30B 11/02; C30B 29/12; G21K 4/00
See application file for complete search history.

(56) References Cited

U.S. PATENT DOCUMENTS

| | | | |
|---|---|---|---|
| 4,261,854 A | 4/1981 | Kotera et al. | |
| 5,140,159 A | 8/1992 | Blasse | |
| 5,517,034 A * | 5/1996 | Neyens | C09K 11/7733 |
| | | | 250/484.4 |
| 5,736,069 A | 4/1998 | Willems | |
| 6,228,286 B1 * | 5/2001 | Leblans | C09K 11/615 |
| | | | 250/362 |
| 2007/0131866 A1 | 6/2007 | Srivastava et al. | |
| 2007/0241284 A1 * | 10/2007 | Iltis | C30B 11/00 |
| | | | 250/361 R |
| 2008/0067391 A1 | 3/2008 | Shigenori et al. | |
| 2008/0093557 A1 | 4/2008 | Cooke et al. | |
| 2008/0131347 A1 | 6/2008 | Srivastava et al. | |
| 2009/0001285 A1 | 1/2009 | Maeda et al. | |
| 2009/0008561 A1 | 1/2009 | Nagarkar et al. | |
| 2011/0108738 A1 | 5/2011 | Doty et al. | |
| 2012/0001282 A1 | 1/2012 | Goto et al. | |
| 2013/0087711 A1 | 4/2013 | Szupryczynski et al. | |
| 2013/0087712 A1 | 4/2013 | Szupryczynski et al. | |

FOREIGN PATENT DOCUMENTS

| | | |
|---|---|---|
| CN | 1629251 A | 6/2005 |
| CN | 1847359 A | 10/2006 |
| CN | 1892251 A | 1/2007 |
| CN | 101200639 A | 6/2008 |
| CN | 101479361 A | 7/2009 |
| DE | 2951516 | 7/1980 |
| EP | 0029963 | 6/1981 |
| EP | 0083071 | 7/1983 |
| JP | H04076088 | 3/1992 |
| JP | H07331240 | 12/1995 |
| JP | 2007205970 | 8/2007 |
| JP | 2007232636 A | 9/2007 |
| JP | 2007327055 | 12/2007 |
| JP | 2008101180 | 5/2008 |
| JP | 2008175815 A | 7/2008 |
| JP | 2010522806 | 7/2010 |
| JP | 2014534304 A | 12/2014 |

(Continued)

OTHER PUBLICATIONS

Roesky et al. Chemistry of aluminium(I), Chemical Communications vol. 32, pp. 4027-4038 (Year: 2005).*
Saksena et al. The electronic spectrum of gallium monoiodide, Journal of Physics B: Atomic, Molecular and Optical Physics vol. 27, No. 16, pp. 3735-3741 (Year: 1994).*
Office Action dated Aug. 3, 2015 in JP Application No. 2014-535774, 6 pages.
CN Office Action in CN Application No. 201280049756.1, dated Nov. 6, 2017, 28 pages.
CN Office Action in CN Application No. 201280049756.1, dated Jul. 28, 2015, 27 pages.
Search Report in PCT/US2012/059279 dated Nov. 29, 2012, 9 pages.
CN Office Action in CN Application No. 201280049752.6, dated May 9, 2016, 20 pages.

(Continued)

*Primary Examiner* — Hugh Maupin

(57) ABSTRACT

The present disclosure discloses, in one arrangement, a scintillator material made of a metal halide with one or more additional group-13 elements. An example of such a compound is Ce:LaBr$_3$ with thallium (Tl) added, either as a codopant or in a stoichiometric admixture and/or solid solution between LaBr$_3$ and TlBr. In another arrangement, the above single crystalline iodide scintillator material can be made by first synthesizing a compound of the above composition and then forming a single crystal from the synthesized compound by, for example, the Vertical Gradient Freeze method. Applications of the scintillator materials include radiation detectors and their use in medical and security imaging.

5 Claims, No Drawings

(56) References Cited

FOREIGN PATENT DOCUMENTS

JP 2014534305 12/2014
WO 2010103917 A1 9/2012

OTHER PUBLICATIONS

Kozlov, Vasilij, "TlBr raw material purification, crystal growth, annealing, detector fabrication and characterisation for gamma-ray detector applications." (Mar. 2010), Dissertation, University of Helsinki.
Office Action dated Aug. 3, 2015 in JP Application No. 2014-535778, 6 pages.
Shah, K.S., Glodo, J., Klugerman, M. Moses, W. W., Derenzo, S.E., & Weber, M. J.; LaBr/sub 3: Ce scintillators for gamma-ray spectroscopy IEEE Transactions on Nuclear Science, 50(6), Dec. 2003, 2410-2413.
Takashi, "Gamma-ray measurements using an inorganic scintillator"; last modified Apr. 3, 2009; http://www.cr.scphys.kyoto-u.ac.jp/gakuba/P6_2007_scinti_report.pdf in particular p. 29.

\* cited by examiner

METAL HALIDE SCINTILLATORS WITH REDUCED HYGROSCOPICITY AND METHOD OF MAKING THE SAME

CROSS-REFERENCE TO RELATED APPLICATIONS

This application is a continuation-in-part of and claims the benefit of U.S. patent application having Ser. No. 13/646,759 filed on Oct. 8, 2012, which claims priority to U.S. Provisional Applications Ser. Nos. 61/545,253 and 61/545,262, both filed Oct. 10, 2011, which provisional applications are incorporated herein by reference in their entirety.

TECHNICAL FIELD

This disclosure relates to scintillator materials used for detecting ionizing radiation, such as X-rays, gamma rays and thermal neutron radiation, in security, medical imaging, particle physics and other applications. This disclosure relates particularly to metal halide scintillator materials. Certain arrangements also relate to specific compositions of such scintillator material, method of making the same and devices with such scintillator materials as components.

BACKGROUND

Scintillator materials, which emit light pulses in response to impinging radiation, such as X-rays, gamma rays and thermal neutron radiation, are used in detectors that have a wide range of applications in medical imaging, particle physics, geological exploration, security and other related areas. Considerations in selecting scintillator materials typically include, but are not limited to, luminosity, decay time, emission wavelengths, and stability of the scintillation material in the intended environment.

While a variety of scintillator materials have been made, there is a continuous need for superior scintillator materials.

SUMMARY OF THE DISCLOSURE

The present disclosure relates generally to metal halide scintillator materials and method of making such scintillator materials. In one arrangement, a scintillator material comprises a metal halide with one or more additional group-13 elements. An example of such a compound is Ce:LaBr$_3$ with thallium (Tl) added, either as a codopant or in a stoichiometric admixture and/or solid solution between LaBr$_3$ and TlBr.

A further aspect of the present disclosure relates to a method of making chloride scintillator materials of the above-mentioned compositions. In one example, high-purity starting halides (such as LaBr$_3$, TlBr and CeBr$_3$) are mixed and melted to synthesize a compound of the desired composition of the scintillator material. A single crystal of the scintillator material is then grown from the synthesized compound by the Bridgman method (or Vertical Gradient Freeze (VGF) method), in which a sealed ampoule containing the synthesized compound is transported from a hot zone to a cold zone through a controlled temperature gradient at a controlled speed to form a single-crystalline scintillator from molten synthesized compound.

Another aspect of the present disclosure relates to a method of using a detector comprising one of the scintillation materials described above for imaging.

DETAILED DESCRIPTION

Metal halides are scintillation compositions commonly known from their good energy resolution and relatively high light output. One significant disadvantage of these materials, however, is their high solubility in water. This high solubility, or hygroscopicity is one of the main reasons that slow down the process of commercialization of these compounds. Crystal growth processes, following a multistage purification, zone refining and drying all require very well controlled atmosphere with depleted content of water and oxygen. Moreover, handling and post-growth processing of these materials typically must be performed in an ultra-dry environment to avoid degradation of the materials. Additionally, these materials typically can be used only in hermetically sealed packaging that prevents materials from degradation due to the hydration effects. Such stringent conditions for making and using metal halide scintillation materials present a significant barrier to commercial application of these materials. Therefore, it is highly desirable to improve or develop new scintillator materials with significantly lower hygroscopicity.

This disclosure relates generally to rare-earth metal halide scintillator materials and method of making such scintillator materials. In one arrangement, the rare-earth metal halide scintillator materials have compositions with reduced hygroscopicity. Compositions in specific implementations include three group of elements: Lanthanides, (La, Ce, Lu, Gd or Y), elements in group 17 of the periodic table of elements (Cl, Br and I) and elements of group 13 (B, Al, Ga, In, Tl, or combinations thereof), and any combination of these elements.

In an embodiment, the composition comprises rare earth metals (cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), yttrium (Y), or combinations thereof) in either their elemental form or in their respective salt forms, elements in group 17 of the periodic table of elements (chlorine (Cl), bromine (Br) and iodine (I)), elements of group 13 (boron (B), aluminum (Al), gallium (Ga), indium (In), thallium (Tl), or combinations thereof) in either their respective salt forms or in their elemental forms, group 1 metals (lithium (Li), sodium (Na), rubidium (Rb), cesium (Cs), potassium (K), or a combination thereof) in their elemental form or in their respective salt form, group 2 metals (strontium (Sr), Calcium (Ca), barium (Ba), or a combination thereof) in their elemental form or in their respective salt form.

In an embodiment, the composition comprises group 1 metals (lithium (Li), sodium (Na), rubidium (Rb), cesium (Cs), potassium (K), or a combination thereof) in their elemental form or in their respective salt form; group 13 elements (boron (B), aluminum (Al), gallium (Ga), indium (In), thallium (Tl), or combinations thereof) in either their respective salt forms or in their elemental forms, rare earth metals (cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), yttrium (Y), or combinations thereof) in either their elemental form or in their respective salt forms; group 2 metals (strontium (Sr), Calcium (Ca), barium (Ba), or a combination thereof) in their elemental form or in their respective salt form; elements in group 17 of the periodic table of elements (chlorine (Cl), bromine (Br) and iodine (I)).

In an embodiment, the molar relationship between the group 1 metals and the group 13 elements is an inverse relationship. In other words, as the number of moles of the group 1 metal in the composition increases, the number of moles of the group 13 element in the composition decreases. In a similar manner, the molar relationship between the rare earth metal and the group 2 metals, when present, is an inverse relationship. In other words, as the number of moles of the group 2 metal in the composition increases, the number of moles of the rare earth metal in the composition decreases. A preferred group 2 metal is calcium, while the preferred rare earth metal is europium.

In another embodiment, the group 2 metal is optional in some compositions.

In yet another embodiment, the composition may comprise a plurality of halides. In yet another embodiment, the plurality of halides can include two or more of chlorine, bromine or iodine.

In yet another embodiment, the halide is preferably a thallium halide.

This disclosure relates to new compositions of metal halide scintillator substance, in particular rear earth metal halides scintillator materials, for gamma and neutron detection with reduced hygroscopicity. The disclosure includes, but is not being limited to, the following families of metal halides compositions described by general chemical formulas:

 (1)

 (2)

 (3)

 (4)

 (5)

 (6)

 (7)

 (8)

 (9)

where:
A'=Li, Na, K, Rb, Cs or any combination thereof,
B'=B, Al, Ga, In, Tl or any combination thereof,
C'=Cl, Br, I or any combination thereof,
M' consist of Ce, Sc, V, La, Lu, Gd, Pr, Tb, Yb, Nd or any combination of them,
M" consists of Sr, Ca, Ba or any combination of thereof,
x is included within the range: $0 \leq x \leq 1$, and
y is included within the range: $0 \leq y \leq 1$.

The physical forms of the scintillator substance include, but are not limited to, crystal, polycrystalline, ceramic, powder or any of composite forms of the material.

A reduction in the hygroscopicity is achieved by co-doping and/or changes in the stoichiometry of a scintillator substance. These changes may be achieved by stoichiometric admixture and/or solid solution of compounds containing elements from group-13 periodic table. These elements are: B, Al, Ga, In, Tl and any combinations of them.

One way of the implementation of this innovation is a codoping with group-13 of elements in concentrations that does not alternate significantly the symmetry of the crystal lattice of the scintillator of choice. Another way includes a complete modification of the crystal structure of the scintillator composition by stoichiometric change or solid solution of scintillator compounds and other compounds containing at least one of group-13 elements. In these cases, new scintillator materials are created with significantly reduced hygroscopicity.

In an embodiment, the composition may be manufactured by heating together group 1 metals (lithium (Li), sodium (Na), rubidium (Rb), cesium (Cs), potassium (K), or a combination thereof) in their elemental form and/or in their respective salt form; group 13 elements (boron (B), aluminum (Al), gallium (Ga), indium (In), thallium (Tl), or combinations thereof) in either their respective salt forms and/or in their elemental forms, rare earth metals (cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), yttrium (Y), or combinations thereof) in their elemental form and/or in their respective salt forms; group 2 metals (strontium (Sr), Calcium (Ca), barium (Ba), or a combination thereof) in their elemental form and/or in their respective salt form; and elements in group 17 of the periodic table of elements (chlorine (Cl), bromine (Br) and iodine (I)). The heating is conducted till the mixture comprising the group 1 metals, the group 13 elements, the rare earth metals, the group 2 metals and the group 17 elements is melted. The molten mixture is then grown into a single crystal.

During the growth into a single crystals, some of the elements that are hitherto in salt form may be transformed into their elemental form. The single crystal may thus contain some elements in both their salt form as well as in their elemental form. It is generally preferred to have the element in the single crystal in its salt form.

In a particular, non-limiting, example, thallium (Tl) is introduced into the crystallographic lattice of $LaBr_3$ compound (formula 9). In this specific example, a strong Tl—Br covalent bond (as opposed to ionic bond in $LaBr_3$) is created that significantly reduces the reactivity of the compound with water.

In the higher concentration of Tl it is possible to create scintillator materials with altered crystallographic lattice. That includes also a stoichiometry change in the crystal itself. The strength of Tl—Br bond is demonstrated in TlBr compound that is known from significantly lower hygroscopicity in comparison to the other metal halides. The expected changes in solubility can be explained based on the HSAB concept, explained in more detail below.

Moreover, introduction of the elements from group-13 into the crystal structure of metal halides often improves scintillation characteristics of these materials. Addition of Tl as a codopant or stoichiometric admixture to certain compositions of metal halides creates very efficient scintillation centers. These centers contribute to the scintillation light output.

In addition, using compounds of group-13 elements can favorably increase the density of the material. Improvement in the density is particularly important in radiation detection applications. The new scintillator materials have applications in Positron Emission Tomography (PET), Single Photon Emission Computed Tomography (SPECT), Computerized Tomography (CT), and other applications used in homeland security and well logging industry.

This disclosure also relates to the method of growing scintillator that includes crystallization of the melted or dissolved scintillator compounds under controlled environment.

The changes in solubility of new metal halides scintillators disclosed herein may be understood based on HSAB concept.

The HSAB is an acronym for "Hard and Soft Acids and Bases" known also, as the Pearson acid-base concept. This concept attempts to unify inorganic and organic reaction chemistry and can be used to explain in qualitative rather than quantitative way the stability of compounds, reaction mechanisms and pathways. The concept assigns the terms 'hard' or 'soft', and 'acid' or 'base' to variety of chemical species. 'Hard' applies to species which are small based on their Ionic radii, have high charge states (the charge criterion applies mainly to acids, to a lesser extent to bases), and are weakly polarizable. 'Soft' applies to species which are big, have low charge states and are strongly polarizable. Polarizable species can form covalent bonds, whereas non-polarizable form ionic bonds. See, for example, (1) Jolly, W. L., Modern Inorganic Chemistry, New York: McGraw-Hill (1984); and (2) E.-C. Koch, Acid-Base Interactions in Energetic Materials: I. The Hard and Soft Acids and Bases (HSAB) Principle-Insights to Reactivity and Sensitivity of Energetic Materials, Prop.,Expl.,Pyrotech. 30 2005, 5. Both of the references are incorporated herein by reference.

In the context of this disclosure the HSAB theory helps in understanding the predominant factors which drive chemical properties and reactions. In this case, the qualitative factor is solubility in water. On the one hand, water is a hard acid and hard base combination, so it is compatible with hard acid and bases. Thallium bromide is, on another hand, a soft acid and soft base combination, so it is not soluble in water.

According to the HSAB theory, soft acids react faster and form stronger bonds with soft bases, whereas hard acids react faster and form stronger bonds with hard bases, all other factors being equal.

Hard acids and hard bases tend to have the following characteristics:
  small atomic/ionic radius
  high oxidation state
  low polarlzabllity
  high electronegativity (bases)

Examples of hard acids include: $H^+$, light alkali ions (for example, Li through K all have small ionic radius), $Ti^{4+}$, $Cr^{3+}$, $Cr^{6+}$, $BF_3$. Examples of hard bases are: $OH^-$, $F^-$, $Cl^-$, $NH_3$, $CH_3COO^-$ and $CO_3^{2-}$. The affinity of hard acids and hard bases for each other is mainly ionic in nature.

Soft acids and soft bases tend to have the following characteristics:
  large atomic/ionic radius
  low or zero oxidation state
  high polarizability
  low electronegativity Examples of soft acids are: $CH_3Hg^+$, $Pt^{2+}$, $Pd^{2+}$, $Ag^+$, $Au^+$, $Hg^{2+}$, $Hg_2^{2+}$, $Cd^{2+}$, $BH_3$ and group-13 in +1 oxidation state. Examples of soft bases include: $H^-$, $R_3P$, $SCN^-$ and $I^-$. The affinity of soft acids and bases for each other is mainly covalent in nature.

There are also borderline cases identified as borderline acids for example: trimethylborane, sulfur dioxide and ferrous $Fe^{2+}$, cobalt $Co^{2+}$, cesium $Cs^+$ and lead $Pb^{2+}$ cations, and borderline bases such as bromine, nitrate and sulfate anions.

Generally speaking, acids and bases interact and the most stable interactions are hard-hard (ionogenic character) and soft-soft (covalent character).

In the specific case presented as an example compounds such as $LaBr_3$ and TlBr have the following elements to consider following reaction with water: $La^{-3}$, $Br^-$, $Tl^+$, $H^-$, $OH^-$.
  $La^{+3}$: This is a strong acid. High positive charge (+3) small ionic radius.
  $Br^-$: This is a soft base. Large ionic radius small charge (−1).
  $Tl^+$: This is a soft acid. Low charge and large ionic radius.
  $H^+$: This is a hard acid. Low ionic radius and high charge density.
  $OH^-$: This is a hard base. Low charge, small ionic radius.

Thus the reaction of $LaBr_3$ and water takes place in according to the following scheme:

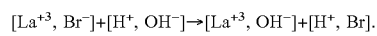

The left hand side of the equation has two components that are being mixed. The right hand side represents products after mixing. One can see that the strong acid $La^{+3}$ with the strong base $OH^-$, are joined together because it makes a strong acid and base combination. The $Br^-$ is driven from the $La^{+3}$ and thus it is complexed with $H^+$, forming hydrobromic acid.

The reaction of TlBr with water following the scheme:

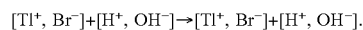

In this case, $Tl^+$ and $Br^-$ are favored because they are a combination of soft-soft acid and base. While the $H^+$ and $OH^-$ are hard acid and base combination. The TlBr is a covalent compound and will dissolve in covalent solvents.

Therefore, in the case of $LaBr_3$, the hard acid $La^{+3}$ "seeks" out $OH^-$, resulting in a high reactivity in water. In contrast, TlBr (soft-soft) does not "seek" water (and vice versa). The result is a low degree of interaction, including solubility with water.

In the examples given above in this disclosure, the addition of TlBr as a co-dopant or in stoichiometric amounts reduces the hygroscopicity of the $LaBr_3$.

A further aspect of the present disclosure relates to a method of making scintillator materials of the above-mentioned compositions. In one example, high-purity starting compounds (such as $LaBr_3$ and TlBr) are mixed and melted to synthesize a compound of the desired composition of the scintillator material. A single crystal of the scintillator material is then grown from the synthesized compound by the Bridgman method (or Vertical Gradient Freeze (VGF) method), in which a sealed ampoule containing the synthesized compound is transported from a hot zone to a cold zone through a controlled temperature gradient at a controlled speed to form a single-crystalline scintillator from molten synthesized compound.

Thus, metal halide scintillation materials with improved moisture resistance, density and/or light output can be made with the addition of group-13 elements such as Tl. Because many embodiments of the invention can be made without departing from the spirit and scope of the invention, the invention resides in the claims hereinafter appended.

We claim:

1. A scintillator composition comprising:
  a group 1 metal in its salt form; where the group 1 metal is lithium (Li), sodium (Na), rubidium (Rb), cesium (Cs), potassium (K), or a combination thereof;
  a group 13 element in its salt form; where the group 13 element is boron (B), aluminum (Al), gallium (Ga), indium (In), or a combination thereof;
  a rare earth metal in its salt form;

a group 2 metal in its salt form, where the group 2 metal is strontium (Sr), calcium (Ca), barium (Ba), or a combination thereof; and a group 17 element;

where the molar relationship between the group 1 metal and the group 13 element is an inverse relationship and where the molar relationship between the rare earth metal and the group 2 metal is an inverse relationship.

2. The scintillator composition of claim 1, where the rare earth metal is cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), yttrium (Y), or a combination thereof.

3. The scintillator composition of claim 1, where the rare earth metal is europium.

4. The scintillator composition of claim 1, where the composition comprises two or more group 17 elements in salt form.

5. A method of forming a single crystal of the scintillator composition of claim 1, the method comprising:

mixing a group 1 metal in its salt form; where the group 1 metal is lithium (Li), sodium (Na), rubidium (Rb), cesium (Cs), potassium (K), or a combination thereof;

a group 13 element in its salt form; a rare earth metal in its salt form; where the group 13 element is boron (B), aluminum (Al), gallium (Ga), indium (In), or a combination thereof;

a rare earth metal in its salt form; and a group 2 metal in its salt form to form, where the group 2 metal is strontium (Sr), calcium (Ca), barium (Ba), or a combination thereof a mixture;

a group 17 element;

where the molar relationship between the group 1 metal and the group 13 element is an inverse relationship and where the molar relationship between the rare earth metal and the group 2 metal is an inverse relationship;

melting the mixture; and growing a single crystal from the melt.

* * * * *